United States Patent
Siong et al.

(10) Patent No.: US 9,165,904 B1
(45) Date of Patent: Oct. 20, 2015

(54) INSULATED WIRE BONDING WITH EFO BEFORE SECOND BOND

(71) Applicants: Chin Teck Siong, Shah Alam (MY); Zi Song Poh, Melaka (MY); Lan Chu Tan, Singapore (SG)

(72) Inventors: Chin Teck Siong, Shah Alam (MY); Zi Song Poh, Melaka (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/306,254

(22) Filed: Jun. 17, 2014

(51) Int. Cl.
*H01L 21/44* (2006.01)
*H01L 23/00* (2006.01)
*B23K 20/00* (2006.01)
*B23K 20/10* (2006.01)

(52) U.S. Cl.
CPC .............. *H01L 24/85* (2013.01); *B23K 20/005* (2013.01); *B23K 20/10* (2013.01); *H01L 24/05* (2013.01); *H01L 24/13* (2013.01); *H01L 24/48* (2013.01); *H01L 2924/01029* (2013.01); *H01L 2924/01079* (2013.01)

(58) Field of Classification Search
CPC ......... H01L 24/85; H01L 24/05; H01L 24/13; H01L 24/48; H01L 2924/01029; B23K 20/005; B23K 20/10; B23K 31/02; B23K 37/04
USPC .......... 438/106, 617; 257/738; 228/45, 110.1, 228/180.5
See application file for complete search history.

(56) References Cited

U.S. PATENT DOCUMENTS

| | | | |
|---|---|---|---|
| 4,513,190 A * | 4/1985 | Ellett et al. | 219/56.21 |
| 4,772,498 A * | 9/1988 | Bertin et al. | 428/34.4 |
| 4,950,866 A | 8/1990 | Kojima | |
| 5,110,032 A | 5/1992 | Akiyama | |
| 5,628,922 A * | 5/1997 | Chen | 219/56.21 |
| 5,839,640 A * | 11/1998 | Kinnaird | 228/4.5 |
| 6,100,511 A | 8/2000 | Kempe | |
| 6,234,376 B1 * | 5/2001 | Wicen | 228/180.5 |
| 6,337,453 B1 * | 1/2002 | Miller et al. | 219/56.21 |
| 6,382,494 B1 * | 5/2002 | Miller | 228/1.1 |
| 6,896,170 B2 | 5/2005 | Lyn | |
| 6,935,551 B2 | 8/2005 | Kondo | |
| 7,137,547 B2 * | 11/2006 | Wakefield | 228/180.5 |
| 7,360,675 B2 | 4/2008 | Persic | |
| 7,476,608 B2 * | 1/2009 | Craig et al. | 438/617 |

(Continued)

FOREIGN PATENT DOCUMENTS

EP 0837750 8/2002

OTHER PUBLICATIONS

"Stitch Bond Enhancement for X-Wire™ Insulated Bonding Wire", Small Precision Tools and Microbonds Inc., 2007.

(Continued)

*Primary Examiner* — Caleb Henry
(74) *Attorney, Agent, or Firm* — Charles E. Bergere

(57) ABSTRACT

A method of attaching a bond wire to first and second electrical contact pads includes holding the bond wire in a capillary, wherein a first end of the bond wire extends out of an opening in the capillary, attaching the first end of the bond wire to the first electrical contact pad using a ball bonding technique, moving a second end of the bond wire toward the second electrical contact pad after the attachment of the first end of the bond wire, performing an electric flame off on the second end of the bond wire without forming a free air ball, and attaching the second end of the bond wire to the second electrical contact pad after the EFO on the second end of the bond wire.

14 Claims, 2 Drawing Sheets

(56) References Cited

U.S. PATENT DOCUMENTS

| | | | |
|---|---|---|---|
| 7,597,231 B2 * | 10/2009 | Castaneda | 228/4.5 |
| 8,496,158 B2 | 7/2013 | Zong et al. | |
| 8,540,136 B1 * | 9/2013 | Lin et al. | 228/180.5 |
| 2002/0056706 A1 * | 5/2002 | Trejo | 219/56.22 |
| 2002/0158374 A1 * | 10/2002 | Billiet et al. | 264/669 |
| 2005/0045692 A1 * | 3/2005 | Harun et al. | 228/110.1 |
| 2005/0133570 A1 * | 6/2005 | Hernandez et al. | 228/178 |
| 2005/0199677 A1 * | 9/2005 | Sadler et al. | 228/4.5 |
| 2005/0260791 A1 * | 11/2005 | Beatson et al. | 438/106 |
| 2005/0279805 A1 * | 12/2005 | Wong et al. | 228/4.5 |
| 2006/0011710 A1 * | 1/2006 | Lee et al. | 228/180.5 |
| 2006/0151571 A1 * | 7/2006 | Liu et al. | 228/4.5 |
| 2007/0015353 A1 * | 1/2007 | Craig et al. | 438/617 |
| 2007/0212869 A1 * | 9/2007 | Chou et al. | 438/617 |
| 2008/0073408 A1 * | 3/2008 | Kwan et al. | 228/101 |
| 2008/0099531 A1 * | 5/2008 | Wong et al. | 228/4.5 |
| 2008/0185737 A1 * | 8/2008 | Marimuthu | 257/780 |
| 2008/0293235 A1 * | 11/2008 | Deju | 438/617 |
| 2009/0091006 A1 * | 4/2009 | Pirkle et al. | 257/666 |
| 2010/0059574 A1 * | 3/2010 | Arahata et al. | 228/180.5 |
| 2010/0200981 A1 * | 8/2010 | Huang et al. | 257/692 |
| 2012/0256314 A1 * | 10/2012 | Har et al. | 257/738 |
| 2013/0062765 A1 * | 3/2013 | Har et al. | 257/738 |
| 2013/0098877 A1 * | 4/2013 | Song et al. | 219/69.11 |
| 2013/0327812 A1 * | 12/2013 | Li et al. | 228/102 |
| 2014/0021605 A1 * | 1/2014 | Yu et al. | 257/738 |
| 2014/0209663 A1 * | 7/2014 | Song et al. | 228/102 |
| 2014/0246480 A1 * | 9/2014 | Gillotti et al. | 228/102 |
| 2014/0263584 A1 * | 9/2014 | Yap et al. | 228/180.5 |
| 2015/0008251 A1 * | 1/2015 | Song et al. | 228/41 |
| 2015/0021376 A1 * | 1/2015 | Uehling et al. | 228/155 |
| 2015/0076714 A1 * | 3/2015 | Haba et al. | 257/738 |
| 2015/0145148 A1 * | 5/2015 | Tran et al. | 257/780 |
| 2015/0194395 A1 * | 7/2015 | Safai et al. | 257/784 |
| 2015/0200143 A1 * | 7/2015 | Gillotti | 228/104 |
| 2015/0200181 A1 * | 7/2015 | Haga et al. | 438/127 |

OTHER PUBLICATIONS

Martin Tarr, "Bonding to the Chip Face", http://www.ami.ac.uk/courses/topics/0268_wb, 2014.

Hsiang-Chen Hsu et al., "An Investigation on Secondary EFO Copper Wire—from a Nanoscale Perspective", 978-1-4673-4944-4, IEEE 2012.

* cited by examiner

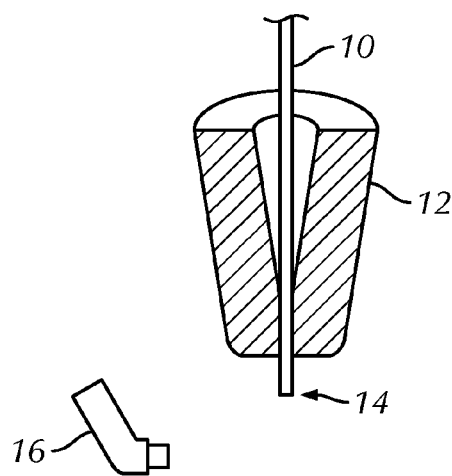
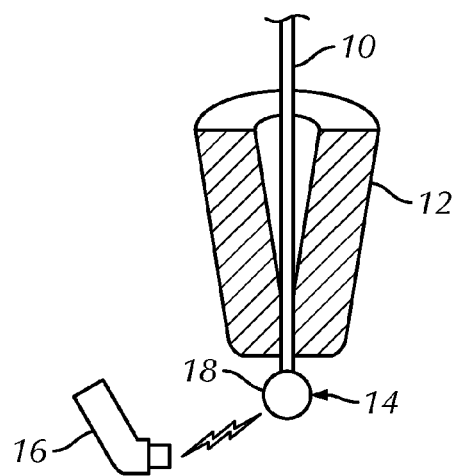
FIG. 1  FIG. 2
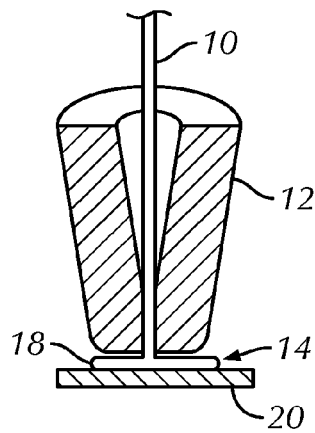
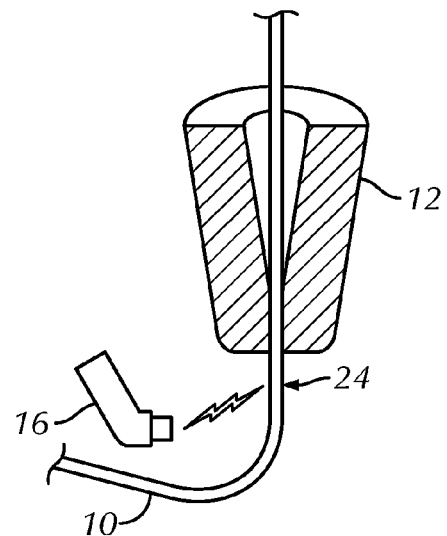
FIG. 3  FIG. 4

INSULATED WIRE BONDING WITH EFO BEFORE SECOND BOND

BACKGROUND OF THE INVENTION

The present invention is directed to semiconductor packaging and, more particularly, to a method of attaching an insulated bond wire to an electrical contact pad.

Semiconductor devices with high pin counts and multi-tiered wire looping present higher opportunities for wiring short circuits. As a result, insulated bond wires are often used as an alternative to traditional bare bond wires. Conventional techniques for attaching the bond wire to an electrical contact pad include the formation of a free air ball (FAB) on a first end of the bond wire using an electric flame off (EFO), bonding the FAB to a first contact pad (first bond), followed by a looping formation, and concluding with a wedge or stitch bond (second bond) formed at the second end of the bond wire on a second contact pad.

Insulated wires can create a problem for the second bond formation because the insulating material can act as a barrier between the core of the bond wire and the contact surface on the substrate, lead frame, or the like. This leads to a poor electrical connection as well as poor physical attachment and bond strength at the second bond.

It is therefore desirable to provide a method for more reliably attaching the second end of an insulated bond wire to an electrical contact pad.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings:

FIG. 1 is a partial cross-sectional view of a bonding capillary and bond wire for use in accordance with a preferred embodiment of the present invention;

FIG. 2 is a partial cross-section elevational view of the capillary and bond wire of FIG. 1 during free air ball (FAB) formation;

FIG. 3 is a partial cross-section elevational view of the capillary and bond wire of FIG. 2 following attachment of a first end of the bond wire to a first electrical contact pad;

FIG. 4 is a partial cross-section elevational view of the capillary and bond wire of FIG. 3 during electric flame off (EFO) at a second end of the bond wire in accordance with a preferred embodiment of the present invention;

DETAILED DESCRIPTION OF THE INVENTION

Figure 5:
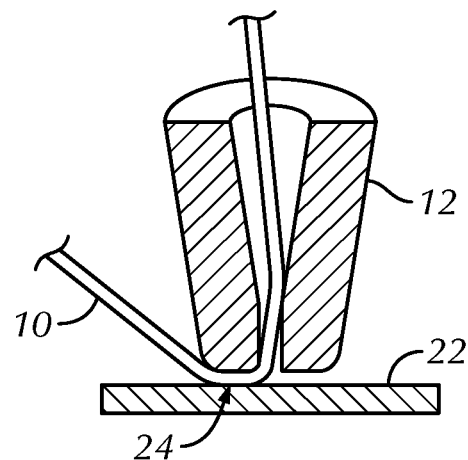
FIG. 5 is a partial cross-section elevational view of the capillary and bond wire of FIG. 4 following attachment of the second end of the bond wire to a second electrical contact pad.

In one embodiment, the present invention provides a method of attaching a bond wire to first and second electrical contact pads. The method includes holding the bond wire in a capillary, wherein a first end of the bond wire extends out of an opening in the capillary, attaching the first end of the bond wire to the first electrical contact pad, moving a second end of the bond wire toward the second electrical contact pad after the attachment of the first end of the bond wire, performing an electric flame off (EFO) on the second end of the bond wire without forming a free air ball (FAB), and attaching the second end of the bond wire to the second electrical contact pad after the EFO on the second end of the bond wire.

In another embodiment, the present invention provides a semiconductor device that includes an integrated circuit die having an active surface with die bonding pads, external electrical connection members, and an insulated bond wire having a first end attached to one of the external electrical connection members, and a second end attached to one of the die bonding pads by performing an electric flame off (EFO) on the second end of the bond wire without forming a free air ball (FAB) and bonding the second end to the one of the die bonding pads.

Referring now to the drawings, wherein the same reference numerals are used to designate the same components throughout the several figures, there is shown in FIGS. 1-5 a method of attaching a bond wire in accordance with a preferred embodiment of the present invention. FIG. 1 shows a bond wire 10 held by a capillary 12. The bond wire 10 is preferably an insulated copper wire, gold wire, or the like, as are known in the art. For example, a typical insulated copper bond wire may have a diameter of 18-25 um, such as insulated PdCu and insulated Cu bond wires available from W.C. Heraeus GmbH or Hanau, Germany. Although the present invention is described with reference to insulated bond wires, it will be understood by those of skill in the art that the present invention also may be applied to coated bond wires, such as a Pd-coated Cu wire. As shown, a first end 14 of the bond wire 10 extends out of an opening in the capillary 12. A wand or torch 16 may be located proximate to the first end 14 of the bond wire 10. The capillary 12 and the torch 16 are part of a wire bonding apparatus such as a K&S 1488 wire bonder made by Kulicke & Soffa of Willow Grove, Pa., as is conventionally known in the art.

Referring now to FIG. 2, the first end 14 of the bond wire 10 may be located over an electrical contact pad (not shown in FIG. 2), such as a die bonding pad or an external electrical connection member. An electric flame off (EFO) process is performed using the torch 16 on the first end 14 of the wire 10 to form a free air ball (FAB) 18 on the first end 14 of the bond wire 10. The EFO process to form the FAB 18 on the first end 14 of the bond wire 10 is preferably performed at a temperature above about 1000° C., with an EFO firing time of about 250-300 microseconds at about 30-60 mA EFO current.

Referring to FIG. 3, the FAB 18 may thereafter be pressed against a first electrical contact pad 20 (e.g., a die bonding pad) and attached thereto with an ultrasonic and/or thermosonic bonding process. This forms a conventional ball bond at the first electrical contact pad 20. As previously mentioned, the attachment of the first end 14 of the wire 10 to the first electrical contact pad 20 is known as the first bond.

Referring to FIG. 4, the capillary 12 is thereafter raised away from the first electrical contact pad 20 and moved toward a second electrical contact pad 22 (see FIG. 5) (e.g., an external electrical connection member), leaving wire in a loop that may take different forms, lengths, and trajectories, depending on the application. A second end 24 of the bond wire 10 is subsequently exposed through the opening in the capillary 12 and is moved toward the second electrical contact pad 22. (Here, second end 24 refers to a location or point within the wire 10 that will be attached to the second contact pad 22).

An EFO is performed on the second end 24 of the bond wire 10, but this time without forming an FAB, in order to remove or prepare for removal the insulation of the bond wire 10. The EFO on the second end 24 of the bond wire 10 is preferably performed at a temperature of between about 250° C. and about 600° C. At these temperatures, insulating material of the bond wire 10 proximate the second end 24 thereof is burned off to expose the metal core. However, by using a temperature lower than that of the EFO performed on the first end 14 of the bond wire 10, the metal of the bond wire 10 is not melted, and hence no FAB is formed at the second end 24 of the bond wire 10. In one embodiment, the EFO firing time for this second EFO is about 50-100 microseconds with an EFO current of <10 mA.

Referring to FIG. 5, the second end 24 of the bond wire 10, which is now substantially, if not entirely, free of insulating material, is attached to the second electrical contact pad 22. The attachment is preferably made by forming a stitch bond, wedge bond, or the like. Specifically, the second end 24 of the bond wire 10 is brought into contact with the second electrical contact pad 22 by the capillary 12. Thermocompression, thermosonic bonding, ultrasonic bonding, or the like is then used to form the bond. Afterward the capillary 12 is raised and the bond wire 10 is separated therefrom. The attachment of the second end 24 to the second contact pad 22 is called the second bond.

As a result of this process, the bond wire 10 has both first and second ends 14, 24 free of insulation material and able to form strong physical and electrical connections with the respective electrical connection pads 20, 22, while having an insulated loop to prevent short circuits on contact with other wires.

Figure 6:
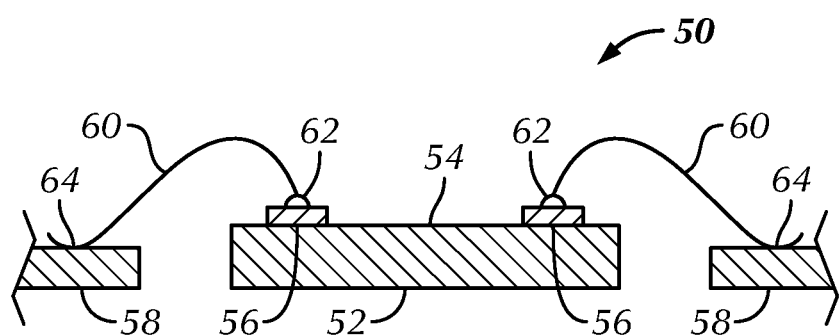
FIG. 6 is an enlarged partial side elevational view of a semiconductor device in accordance with a preferred embodiment of the present invention.

Referring now to FIG. 6, an enlarged cross-sectional side view of a semiconductor device 50 in accordance with a preferred embodiment of the present invention is shown. The semiconductor device 50 includes an integrated circuit die 52 having an active surface 54 with die bonding pads 56 located thereon. The bonding pads 56 typically are located around the periphery of the die 52 but the bonding pads 56 also could be formed in an array over a central area of the active surface 54. The device 50 also includes external electrical connection members 58, which in the embodiment shown, are lead fingers of a lead frame. An insulated bond wire 60 is attached to one of the die bonding pads 56 and to one of the external electrical connection members 58 in the manner described above.

For example, in the embodiment of FIG. 6, the bond wire 60 is attached to one of the die bonding pads 56 by performing an EFO on a first end of the bond wire 60 to form a FAB (e.g., FIG. 2) and attaching the FAB to the die bonding pad 56 to form a ball bond 62. The second end of the bond wire 60 is attached to an external electrical connection member 58 by performing an EFO on the second end of the bond wire 60 without forming a FAB, and bonding the second end, which is now preferably substantially free of insulating material, to the external electrical connection member 58 to form a stitch bond 64, although a wedge bond (not shown) could also be used.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and with the exception of expressly ordered steps, the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of attaching a bond wire to first and second electrical contact pads, the method comprising:
    holding the bond wire in a capillary, wherein a first end of the bond wire extends out of an opening in the capillary;
    attaching the first end of the bond wire to the first electrical contact pad;
    moving a second end of the bond wire toward the second electrical contact pad after the attachment of the first end of the bond wire;
    performing an electric flame off (EFO) on the second end of the bond wire without forming a free air ball (FAB); and
    attaching the second end of the bond wire to the second electrical contact pad after the EFO on the second end of the bond wire.

2. The method of claim 1, further comprising:
    performing an EFO on the first end of the bond wire to form a free air ball at the first end of the bond wire prior to attachment of the first end of the bond wire to the first electrical contact pad.

3. The method of claim 2, wherein the EFO on the first end of the bond wire is performed at a temperature greater than about 1000° C.

4. The method of claim 3, wherein the EFO on the second end of the bond wire is performed at a temperature between about 250° C. and about 600° C.

5. The method of claim 2, wherein attachment of the first end of the bond wire to the first electrical contact pad is performed by one of a thermosonic bonding process or an ultrasonic bonding process.

6. The method of claim 1, wherein the attaching of the second end of the bond wire comprises forming one of a wedge bond or a stitch bond.

7. The method of claim 1, wherein the EFO on the second end of the bond wire is performed at a temperature between about 250° C. and about 600° C.

8. The method of claim 1, wherein the bond wire is one of an insulated copper wire or an insulated gold wire.

9. The method of claim 1, further comprising:
separating the bond wire from the capillary following attachment of the second end of the bond wire.

10. The method of claim 1, wherein the bond wire comprises an insulated bond wire.

11. The method of claim 1, wherein the bond wire comprises a Pd coated copper wire.

12. A method of attaching a bond wire to first and second electrical contact pads, the method comprising:
holding the bond wire in a capillary, wherein a first end of the bond wire extends out of an opening in the capillary;
performing a first electrical flame off (EFO) on the first end of the bond wire to form a free air ball (FAB) on the bond wire first end;
attaching the FAB to the first electrical contact pad;
moving a second end of the bond wire from the first contact pad toward the second electrical contact pad after the attachment of the first end of the bond wire;
performing a second EFO on the second end of the bond wire without forming a FAB; and
attaching the second end of the bond wire to the second electrical contact pad after performing the second EFO.

13. The method of claim 12, wherein the first EFO is performed with a temperature of about 1000° C. and the second EFO is performed with a temperature of about 500° C.

14. The method of claim 12, wherein the bond wire comprises an insulated bond wire and the second EFO substantially removes the insulation from the second end of the bond wire.

* * * * *